United States Patent
Vogeli et al.

(10) Patent No.: US 7,303,860 B1
(45) Date of Patent: Dec. 4, 2007

(54) SYSTEM AND METHOD FOR PERFORMING MULTI-RESOLUTION LITHOGRAPHY

(75) Inventors: Bernhard Vogeli, Boston, MA (US); Timothy A. Savas, Cambridge, MA (US); Henry I. Smith, Sudbury, MA (US); Caroline A. Ross, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 102 days.

(21) Appl. No.: 10/313,309

(22) Filed: Dec. 6, 2002

Related U.S. Application Data

(60) Provisional application No. 60/340,058, filed on Dec. 6, 2001.

(51) Int. Cl.
  *G03F 7/26* (2006.01)
(52) U.S. Cl. ........................ 430/316; 430/313
(58) Field of Classification Search ............... 430/312, 430/313, 316, 394, 296
See application file for complete search history.

(56) References Cited

U.S. PATENT DOCUMENTS

| | | | | |
|---|---|---|---|---|
| 4,496,419 A | * | 1/1985 | Nulman et al. | 438/669 |
| 6,472,317 B1 | * | 10/2002 | Wang et al. | 438/638 |
| 6,605,541 B1 | * | 8/2003 | Yu | 438/700 |

FOREIGN PATENT DOCUMENTS

JP    09-213606    *    8/1997

* cited by examiner

*Primary Examiner*—Kathleen Duda
(74) *Attorney, Agent, or Firm*—Gauthier & Connors LLP

(57) ABSTRACT

A micro-fabricated structure and method of forming a micro-fabricated structure are disclosed. The method includes the steps of forming a first pattern in a first photo-resist, transferring the first pattern in the first photo-resist to a mask layer, forming a second pattern in a second photo-resist, and transferring the second pattern in the second photo-resist to the mask layer. In various embodiments, the method may further include the steps of forming a first pattern in a first photo-resist, forming a second pattern in a second photo-resist, and transferring the first and second patterns to a target layer.

20 Claims, 8 Drawing Sheets

SYSTEM AND METHOD FOR PERFORMING MULTI-RESOLUTION LITHOGRAPHY

The present application claims priority to U.S. Provisional Patent Application Ser. No. 60/340,058 filed Dec. 6, 2001.

This invention was made with government support under Grant No. DAAG55-98-1-0130, awarded by the United States Army. The government has certain rights in the invention

BACKGROUND OF THE INVENTION

The invention relates to the formation of micro-fabricated structures, and relates in particular to the formation of multi-resolution micro-fabricated structures.

Micro-fabricated structures, such as microelectronic circuits and micro-electromechanical devices, are conventionally produced by monolithic fabrication processes that employ planar photolithographic techniques. The multielectronic circuits may, for example, comprise microprocessors, memory chips, magnetic read heads, and other electronic or micro-electromechanical devices. Planar photolithographic techniques typically, involve exposing and developing a layer of photo-resist with a selected masking pattern from a mask or from a direct-write patterning technique, transferring the pattern into a target material layer to be patterned, and then stripping the photo-resist. During the step of pattern transfer to the target material layer to be patterned, the patterned photo-resist layer typically serves as a pattern transfer mask, e.g., an etch mask, and the layer of photo-resist, therefore, generally is required to contain all of the features to be transferred to the target material layer.

Current micro-fabricated structures and systems typically include features having dimensions that vary from several microns to as small as 100 nm. As it becomes increasingly desirable to create micro-fabricated structures having dimensions in nanometers, the smallest features of such devices and systems may reach resolution limits of optical lithographic techniques. Other patterning techniques, such as scanning probe lithography or electron beam lithography (E-beam lithography) may be required to pattern the very small features of state of the art devices and systems. Such direct-write techniques, however, are typically serial processes, requiring that a pattern be written across a layer serially rather than across the layer simultaneously, and as such are relatively very slow.

There is a need therefore, for a method of efficiently fabricating multi-resolution micro-fabricated structures.

SUMMARY OF THE INVENTION

The invention provides micro-fabricated structure and method of forming a micro-fabricated structure. In an embodiment, the method includes the steps of forming a first pattern in a first photo-resist, transferring the first pattern in the first photo-resist to a mask layer, forming a second pattern in a second photo-resist, and transferring the second pattern in the second photo-resist to the mask layer. In various embodiments, the steps of transferring may involve the removal of at least a portion of a mask layer. In a further embodiment, the method may include the steps of forming a first pattern in a first photo-resist, transferring the first pattern in the first photo-resist to a first mask layer, forming a second pattern in a second photo-resist, transferring the second pattern in the second photo-resist to a second mask layer, and transferring the first pattern and the second pattern from the first and second mask layers to a target layer.

The invention also provides, in accordance with a further embodiment, a micro-fabricated structure that includes first portions thereof having a first resolution, and second portions thereof having a second resolution that is different than the resolution of the first portions. In further embodiments, the first and second portions are co-planar.

BRIEF DESCRIPTION OF THE DRAWING

The following description may be further understood with reference to the accompanying drawings in which:

FIGS. 14A-16A show illustrative diagrammatic views of the substrate shown in FIGS. 6-13 during an alternative process of forming a micro-fabricated structure in accordance with an embodiment of the invention;

The drawings are shown for illustrative purposes and are not to scale.

DETAILED DESCRIPTION OF THE ILLUSTRATED EMBODIMENTS

It has been discovered that the fine features of a micro-fabricated structure may be written into a photo-resist layer by the slow, serial patterning processes, with more coarse features then being produced separately in the same photo-resist layer by a separate conventional optical lithography step. After this serial writing and optical patterning, and then development of the photo-resist layer, the photo-resist layer contains both the serially-written fine features as well as the more coarse, optically produced features. As will be recognized, further photo-resist patterning techniques could be employed beyond those disclosed herein. With all of the features in place on the photo-resist layer after the series of photo-resist patterning steps, the pattern of the photo-resist layer may then be transferred into an underlying target material layer, followed by the removal of the resist.

Figure 1:
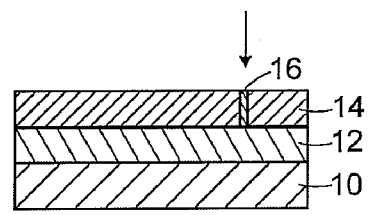
FIGS. 1-5 show illustrative diagrammatic views of a substrate during a process of forming a micro-fabricated structure in accordance with an embodiment of the invention.
Figure 2:
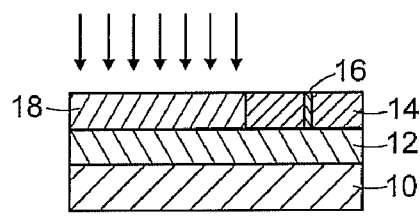
Figure 3:
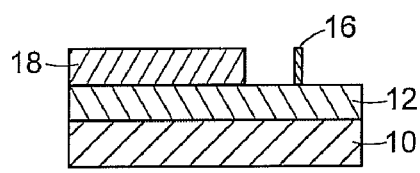
Figure 4:
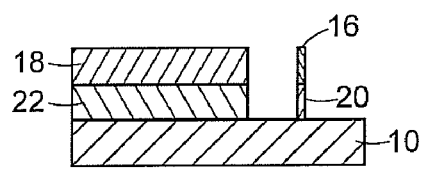
Figure 5:
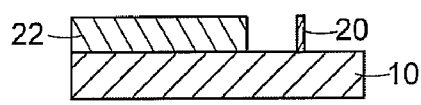

As shown in FIG. 1, a process of forming a micro-fabricated structure in accordance with an embodiment of the invention may involve first depositing a target layer 12 onto a substrate 10, followed by a photo-resist layer 14. A fine feature is then written into a portion 16 in the photo-resist layer 14. A coarse feature may then be exposed by optical photolithography into a different portion 18 of the same photo-resist layer 14 as shown in FIG. 2. The unexposed portions of the photo-resist layer 14 are then removed as shown in FIG. 3, and the pattern is then transferred to fine and coarse portions 20 and 22 respectively of the underlying target layer as shown in FIG. 4 by removing the exposed portions of the target layer that are not masked by the portions 16 and 18 of the photo-resist layer 14. The exposed portions of the target layer 12 are then removed as shown in FIG. 5, leaving a micro-fabricated structure that includes both fine and coarse features 20 and 22 respectively in the target layer 12.

In certain embodiments, the chemical and optical properties of the photo-resist, as well as the thickness of the photo-resist should be compatible with all of the lithographic techniques to be applied to the photo-resist layer. For certain applications, however, and for many photo-resist chemistries typically employed in commercial fabrication environments, this may not be the case. A photo-resist chemistry that is optimized for optical lithography may not be optimized for E-beam lithography and/or exposure or other serial pattern writing processes. The multi-patterning processes shown in FIGS. 1-5, therefore, may not be practical in certain applications.

In accordance with further embodiments of the invention, it has been discovered that a plurality of photo-resist layers may be used for the different lithographic techniques. In particular, the invention provides a process for enabling the combination of two or more different lithographic techniques that each require distinct photo-resist properties and that are, therefore, each provided with a separate photo-resist layer. The lithographic processes of the invention enable the production of a hard mask layer that in one layer contains all features produced by the separate lithographic processes and corresponding photo-resist layers, providing a straightforward mask for enabling pattern transfer from the hard mask layer into an underlying target layer.

Figure 6:
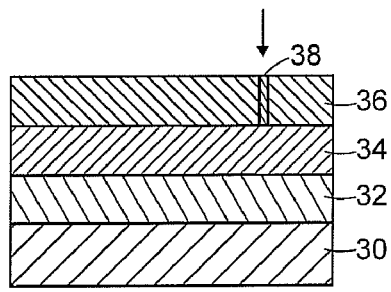
FIGS. 6-16 show illustrative diagrammatic views of another substrate during another process of forming a micro-fabricated structure in accordance with another embodiment of the invention.

A further method of forming a micro-fabricated structure of the invention is shown in FIGS. 6-16. First, a composite substrate is formed of a base substrate 30, a target layer 32, followed by a hard mask 34 and a photo-resist layer 36. The features to be patterned into the underlying target layer 32 are produced in a portion 38 of the first layer of photo-resist using a suitable process, e.g., an optical process or a serial lithographic means such as E-beam writing as shown in FIG. 6. In one example, the first pattern is of relatively fine features, requiring the use of a serial means such as E-beam writing, as shown in FIG. 6. The invention does not require, however, that the first pattern produced be the finest. The underlying hard mask material may be chosen to minimize electron back-scattering and pattern broadening.

Figure 7:
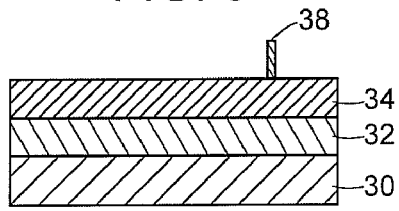
Figure 8:
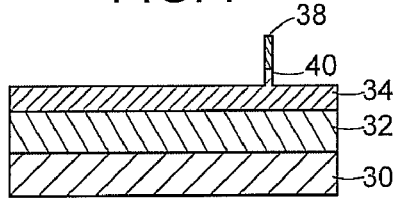
Figure 9:
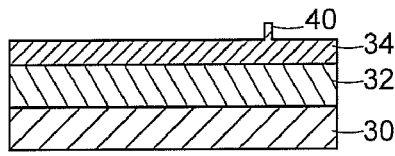

After photo-resist development, as shown in FIG. 7, the photo-resist pattern is transferred into a portion 40 of the underlying hard mask layer 34 by a suitable etching process as shown in FIG. 8. The etching is preferably timed such that only a portion, e.g., one-half, of the hard mask layer thickness is removed as the pattern is produced in the hard mask layer, as shown in FIG. 8. At this point in the process, the remaining photo-resist may be stripped off of the hard mask layer leaving a pattern 40 in the hard mask layer 34 as shown in FIG. 9. The hard mask surface may appear as shown in the scanning electron micrograph shown in FIG. 17A. Such removal of photo-resist remnants is not required for process sequences in which a subsequent layer of photo-resist to be employed is much thicker than this first layer of photo-resist. In this scenario, the remaining first layer of resist may be employed to build up the second layer of resist.

Figure 10:
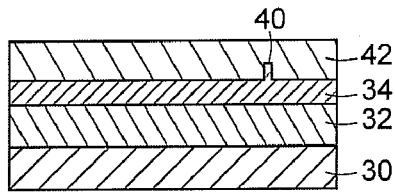
Figure 11:
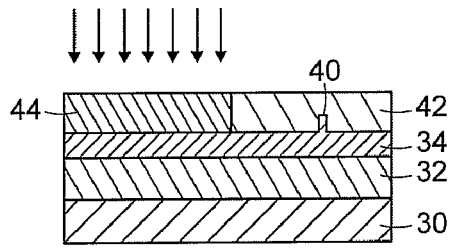
Figure 12:
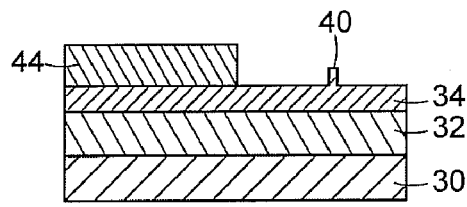

A second layer of photo-resist 42 is then deposited over the patterned hard mask layer, as shown in FIG. 10. A second lithographic procedure, which may be distinct from the first lithographic procedure, e.g., being conventional optical lithography as opposed to a first serial-write lithographic process, or the same as the first lithographic process, is carried out on the second photo-resist layer 42, as shown at 44 in FIG. 11. This photo-resist layer 42 is then developed removing the unexposed portion of the photo-resist layer as shown in FIG. 12. The second photo-resist layer's chemistry and thickness may be tailored for the requirements of the second lithographic process to be carried out. Note that although the figure shows, for clarity, a scenario in which the pattern for the second photo-resist layer is laterally removed from the first photo-resist layer pattern, such is not required by the invention. As described in detail below, the second, as well as subsequent photo-resist layer patterns, may overlap with the first photo-resist layer pattern.

Figure 13:
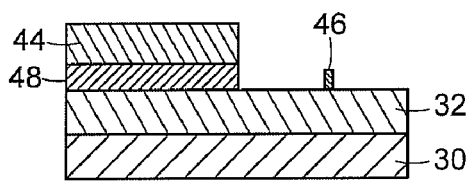

With the second photo-resist layer developed, the underlying hard mask layer 34 is then correspondingly patterned into portions 46 and 48 from the second photo-resist layer pattern as shown in FIG. 13. If reactive ion etching of the hard mask layer is employed here, it can be preferable to dilute the etch gas with oxygen to strip the second layer of photo-resist as the hard mask layer is being etched. If such is not feasible or preferable, then the second layer of photo-resist may be maintained at the end of the hard mask patterning step.

Depending on the thickness of the hard mask layer 34 and the amount of hard mask layer removed by the first lithographic patterning step, the second patterning of the hard mask layer removes a portion of the hard mask layer, and perhaps the remainder of the hard mask layer in the field areas around the patterns. For example, given that the first hard mask layer patterning step removes half the hard mask layer thickness, and given that the second hard mask layer patterning step also removes half of the hard mask layer thickness, then for this example, as shown in FIG. 13, the hard mask layer is entirely removed where not protected by the second photo-resist layer or the thicker region of the first pattern of the hard mask layer. At this point, the hard mask contains the patterns of both lithographic steps.

Figure 14:
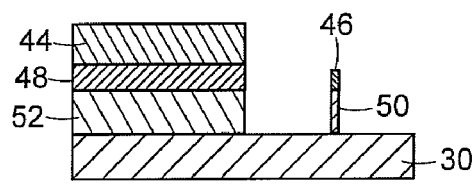
Figure 15:
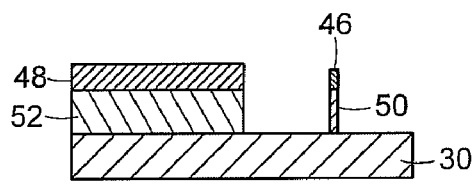
Figure 16:
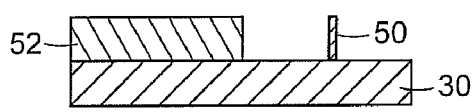

With this second patterning step complete, the two patterns are then transferred to portions 50 and 52 of the underlying target layer 32 as shown in FIG. 14. As explained above, only two patterns are shown in this example for clarity, but it is to be recognized that a greater number of photo-resist layers and corresponding patterns could be employed. An example of the step of transferring two patterns to the hard mask layer is shown in the scanning electron micrograph of FIG. 17B. Once the target layer is etched, any remaining photo-resist may be removed as shown in FIG. 15, and the hard mask layer may then be removed as shown in FIG. 16.

Figure 14A:
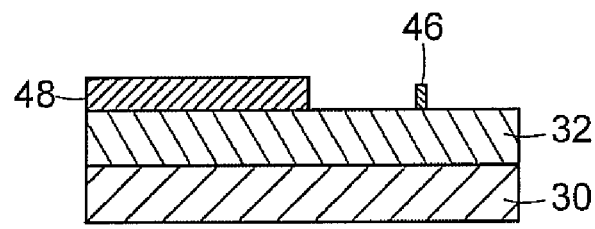
Figure 15A:
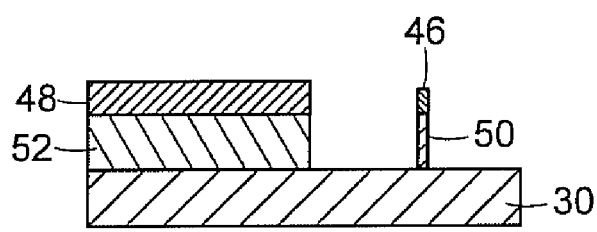
Figure 16A:
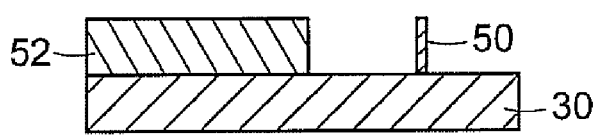

As shown in FIGS. 14A, 15A and 16A, in accordance with another embodiment of the invention, the substrate of FIG. 13 the photo-resist may be removed prior to etching the target layer (FIG. 14A), followed by etching the target layer (FIG. 15A), and then removal of the mask layer (FIG. 16A). Further, the first lithographic procedure may involve the use of optical lithography (for forming the coarse pattern), while the second lithographic procedure may involve the use of electron beam lithography (for forming the more fine pattern). In still further embodiments, the first and second lithographic procedures may employ the same lithographic techniques.

It will be recognized in accordance with the invention that the hard mask material may be selected such that substantially complete removal of the hard mask is achieved upon completion of pattern transfer to the target layer. For example, given a target layer material of tungsten and a hard mask layer material of silicon dioxide, an appropriate reactive ion etch may be determined, e.g., including the etch species $CF_4$ and $O_2$, which transfers the pattern to the tungsten while stripping the silicon dioxide hard mask layer at the same time. This may enhance efficiency of the process flow, but is not required by the invention.

Figure 17A:
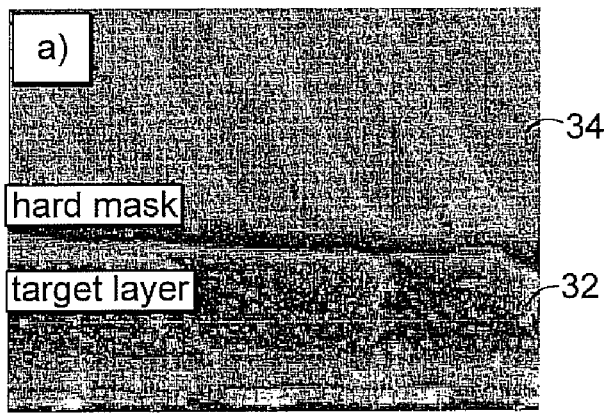
FIGS. 17A and 17B show illustrative photographic views of a micro-fabricated structure that is formed in accordance with another embodiment of the invention.
Figure 17B:
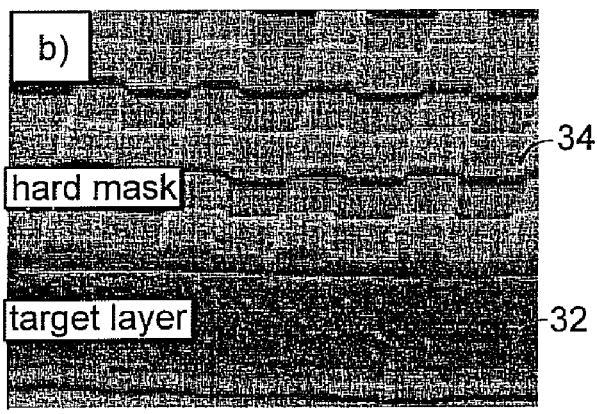
Figure 18:
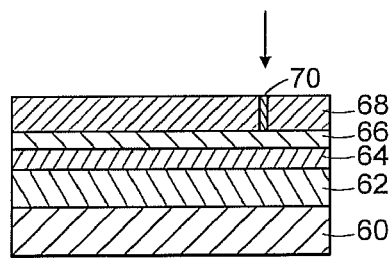
FIGS. 18-28 show illustrative diagrammatic views of a further substrate during a further process of forming a micro-fabricated structure in accordance with a further embodiment of the invention.

As discussed above, this process does not require that the patterns for each lithographic step be isolated laterally. The patterns may overlap and/or cross each other; it is this feature that enables a wide range of pattern options. FIGS. 17A and 17B, mentioned above, show examples in which two different grating patterns are employed that are orthogonal to each other and are to be transferred to a target layer; this is carried out in accordance with the invention by employing two different resist layers, one for each grating pattern. In this example, a layer of silicon dioxide was employed as the hard mask layer.

In FIG. 17A a first grating pattern may be seen etched partially into the hard mask layer, corresponding to the step of FIG. 9. In FIG. 17B two gratings may be seen etched orthogonally into the silicon dioxide hard mask layer, corresponding to the step of FIG. 13; in this process, the second photo-resist layer was removed by the second hard mask etch process in the manner described above. Note that the process for which the samples of FIGS. 17A and 17B were produced did not employ two patterns of largely different dimensions; as seen in the scanning electron micrographs, the two grating patterns are of similar dimensions. This scenario is contemplated by the invention as an elegant technique for producing a pattern, such as orthogonal gratings, that could not be produced simply with a single photo-resist layer. Of course, the two grating dimensions could have been quite different, and could have been produced with distinct lithographic techniques in the manner described above. FIG. 17A exhibits features etched partially into a 60 nm thick silicon dioxide hard mask. The pattern was generated by interference lithography and then transferred 20 nm into the hard mask using a timed reactive ion etch step in a $CHF_3$ plasma at a pressure of about 7 mTorr and a voltage of about 200 V. The line width of this grating is 120 nm. FIG. 17B was achieved using interference lithography on a second layer of photo-resist, a second grating was exposed and again etched 20 nm deep into the same hard mask employing the conditions given above, creating a silicon dioxide hard mask surface containing the complete pattern of two orthogonal gratings. By choosing an appropriately timed reactive ion etch step, one can then readily produce a pattern with uniformly shaped rectangular holes or dots for transfer to an underlying target layer. This example illustrates the ability of the lithographic processing of the invention to produce feature dimensions that are smaller than those of either of the two (or more) separate lithographic steps employed to produce the dimensions.

The invention contemplates a wide range of options for the lithographic processes described above. For example, two hard mask layers may be employed in place of the one hard mask layer described above and shown in the process flow of FIGS. 6-16. In this case, the lower hard mask layer may be employed as a hard etch stop layer when transferring the pattern into the upper hard mask layer. This eliminates the need to time the first pattern transfer etch as shown in FIG. 8. The use of two distinct hard mask layers also enables the provision of specific electrical properties that can be required for specific lithographic processes. For example, where scanning probe lithography (SPL), which operates by applying an electrical current through a tip of an atomic force microscope (AFM), is to be employed, the upper hard mask material can be selected to operate as an electrode, therefore being provided as, e.g., a semiconductor or metal layer. The lower hard mask layer can be a nonconductive material, such as silicon dioxide or a polymer, for use in, e.g., standard optical lithography.

Figure 19:
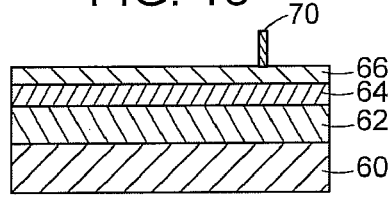
Figure 20:
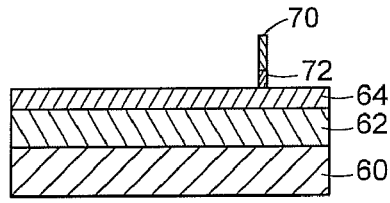
Figure 21:
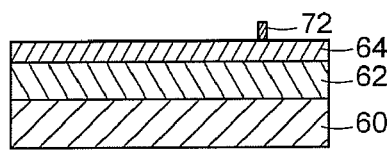

FIGS. 18-28 show a further process in accordance with an embodiment of the invention utilizing a two-layer hard mask. The composite substrate of FIG. 18 includes a base substrate 60, a target layer 62, and two hard mask layers 64 and 66, followed by a photo-resist layer 68. In this process the target layer is here capped with a hard mask that consists of two layers each of a different material. As in the process described above with reference to FIGS. 6-16, a first photoresist layer is spun on top of the hard mask layers and then patterned as shown at 70 in FIG. 18. The photo-resist is then developed removing the unexposed portion of the photo-resist as shown in FIG. 19. This pattern is then transferred into the hard-mask's top layer 66 as shown in FIG. 20, and then the photo-resist layer is removed, as shown in FIG. 21. Note in FIG. 21 that in this example the entire top hard mask layer has been removed by the pattern transfer to that layer. By choosing appropriate material, the interface of the two hard-mask layers provides an etch stop and a timed etch is thus not required for this pattern transfer.

Figure 22:
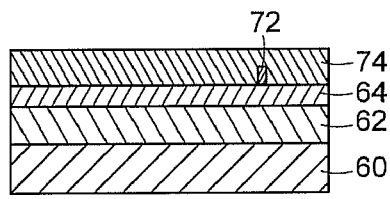
Figure 23:
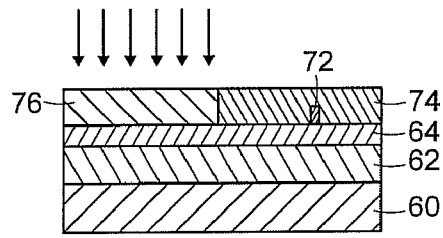
Figure 24:
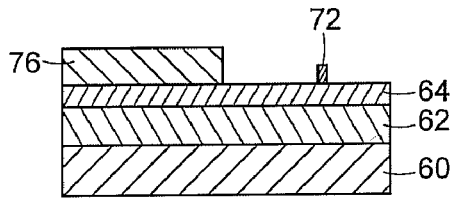
Figure 25:
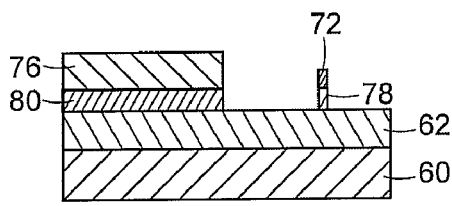
Figure 26:
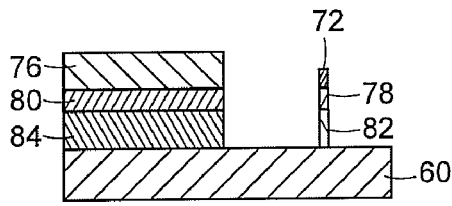
Figure 27:
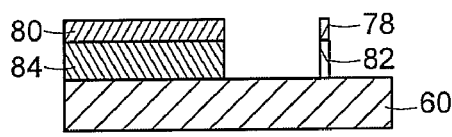
Figure 28:
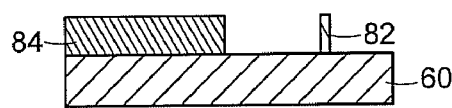

A second layer of photo-resist 74 is then applied to the hard mask layer as shown in FIG. 22, and a second lithography step is performed exposing a portion 76 of the photo-resist layer 74 as shown in FIG. 23. After photo-resist development as shown in FIG. 24, the bottom layer of the hard mask is etched as shown at 78, 80 in FIG. 25, preferably employing the interface between the target material and the hard-mask as an etch stop. As illustrated in FIG. 25, with this patterning complete, the lower layer of the hard mask now contains all features from the two lithographic processes. As explained above, it may be preferred for some applications to adjust this hard mask etch process to enable stripping of the photo-resist as the hard mask is etched. At this point, the pattern of the hard mask can be transferred to the underlying target layer by a suitable etch process as shown at 82, 84 in FIG. 26, and then any remaining photo-resist may be removed as shown in FIG. 27, followed by the removal of the lower hard mask layer as shown in FIG. 28. In the manner explained above, the target layer etch chemistry can be adjusted such that the upper and lower hard mask layers are substantially entirely removed during the target layer etch process.

Figure 26A:
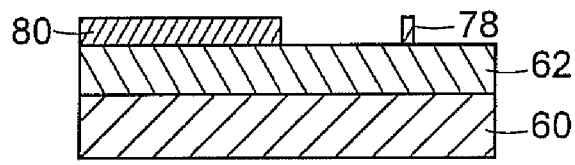
FIGS. 26A and 28A show illustrative diagrammatic views of the substrate shown in FIGS. 18-25 during an alternative process of forming a micro-fabricated structure in accordance with an embodiment of the invention.
Figure 27A:
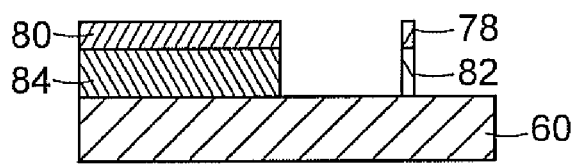
Figure 28A:
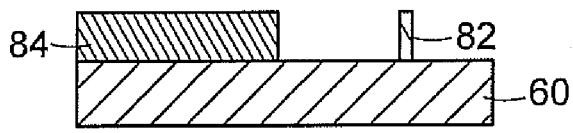

As shown in FIGS. 26A, 27A and 28A, in accordance with another embodiment of the invention in which the substrate of FIG. 25 is formed as discussed above, the photo-resist and the remains of the first hard mask 72, 76 may be removed prior to etching the target layer 62 (FIG. 26A), followed by etching the target layer 82, 84 (FIG. 27A), and then removal of the mask layer 78, 80 (FIG. 28A).

Based on this description, it should be clear that the use of two hard mask layers may be exploited to provide an automatic etch stop that eliminates the need for timed etches, and therefore enhances the reproducibility and manufacturability of the processes. In this case, it may be preferred to optimize mask thickness and selectivity. For example, the lower hard mask layer may be selected based on the target material such that the etch species of the hard mask material exhibits a high degree of selectivity between the lower mask layer and the target material. While these constraints are not required by the invention, they can for many applications enhance the quality and reproducibility of the process.

The example processes described above point out many of the advantages provided by the invention. These processes are found to be particularly advantageous for applications in which two or more different types of lithographic patterning are required to produce a device or system. For example, if a device calls for the production of a set of coarse features made, e.g., by optical lithography, combined with finer features made by, e.g., electron beam or scanning probe lithography, the processes of the invention enable the production of the range of feature dimensions. In a further example the invention enables a periodic pattern produced by interference lithography to be combined with an aperiodic pattern produced by optical, e-beam or other processes. The process of the invention is thus found to maximize process efficiency by enabling the pairing of a device feature with that lithographic process which can most efficiently produce the feature. Serial-writing lithographic processes, being relatively inefficient, are best employed only with those features that require the precision of such; more coarse and/or periodic features that do not require the use of a serial-writing process can be efficiently produced in a separate lithographic step with a distinct lithographic process. Examples of applications requiring such include the read element in a hard disk, where there is only one small feature amongst many larger features, in the production of the small magnetic elements in magnetic random access memories or micro-electromechanical structures amidst larger features of a device or system.

The invention further enables the production of, e.g., two periodic patterns that are made by two different interference lithography steps, as in the orthogonal gratings shown in FIG. 17B. Another class of applications well-addressed by the invention are those requiring the patterning of a periodic structure using interference lithography, self-assembled block copolymer lithography, etc., and then placing aperiodic structures on this pattern, e.g., patterned media with servo-marks written on top. As device and system sizes shrink, the combined patterning techniques provided by the invention will become increasingly valuable because it will not be possible to produce the smallest critical features by conventional optical patterning and for many applications, serial-write patterning is too inefficient or not feasible.

The invention is further particularly advantageous in that it accommodates the use of multiple types of photo-resist to produce a final pattern in a target layer. As explained above, photo-resist materials that are optimized for electron beam lithography may not be sufficiently sensitive for an exposure by optical lithography. On the other hand, photo-resist that is optimized for optical lithography may not have the resolution required to create the finest features written by electron beam lithography. Therefore, where the production of a particular pattern requires the use of both types of lithography, the invention enables use of a photo-resist that is optimized for each type. It is the use of a single hard mask, whether of one or more layers thick, that enables preservation of a pattern produced by a first lithographic process while a second lithographic process is carried out. As explained above, there is no requirement as to the order in which a sequence of distinct lithographic processes are carried out.

Given the ability of the processes of the invention to accommodate a wide range of photo-resist chemistries and thicknesses, it is preferable that this be exploited to enable selection of distinct photo-resist layers that are each optimized for a corresponding lithographic process to be carried out. For example, where an E-beam lithographic step is to be employed, a polymethyl methacrylate resist can be selected for one of the photo-resist layers; where an optical lithography step is to be included, any in a range of photo-resists that are sensitive to the wavelength of light to be employed can be selected for a corresponding photo-resist layer.

The hard mask layer or layers are preferably chosen for an ability to be etched in a manner that accommodates the feature dimensions of interest. For many applications, this consideration leads to the selected of hard mask layers that can be reactive ion etched. The etch selectivity with respect to the photo-resist layers and the target material are also to be considered in selection of a hard mask layer, in the manner discussed above. For many applications, it is found that silicon dioxide works well in a single-layer hard mask process where the target material is a polymeric antireflective coating, for example. Silicon dioxide and tungsten work well as dual hard mask layers in a process suited for such, e.g., in the patterning of magnetic films. It is found that for applications where it is required to etch a target layer by ion milling, e.g., where patterning of certain metals is required, the use of a hard mask in the manner of the invention can be particularly advantageous, given that photo-resist is typically a very poor etch mask for ion milling an underlying metal layer.

The invention has thus been shown to enable a wide range of pattern transfer scenarios that are not addressed or enabled by conventional lithography.

Those skilled in the art will appreciate that numerous modifications and variations may be made to the above disclosed embodiments without departing from the spirit and scope of the invention.

What is claimed is:

1. A method of forming a micro-fabricated structure, said method comprising the steps of:
    forming a first pattern in a first photo-resist;
    removing a portion of said first photo-resist that is associated with a negative of said first pattern;
    transferring said first pattern in said first photo-resist to a first mask layer to provide a patterned first mask layer by removing a portion of said first mask layer to provide exposed portions of a second mask layer;
    depositing a second photo-resist on said exposed portions of said second mask layer;
    forming a second pattern in the second photo-resist;
    transferring said second pattern in said second photo-resist to said second mask layer;
    transferring said first pattern from said first mask layer to said second mask layer;
    transferring said first pattern from said second mask layer to a target layer;
    transferring said second pattern from said second mask layer to the target layer; and
    removing said second mask layer.

2. The method as claimed in claim 1, wherein said step of transferring said second pattern to said second mask layer includes the step of removing a portion of said mask second mask layer.

3. The method as claimed in claim 1, wherein said first mask layer and said second mask layer are formed as a single mask layer that is thick enough to permit an upper portion thereof to provide the first mask layer and a bottom portion thereof to provide the second mask layer.

4. The method as claimed in claim 1, wherein said step of forming the first pattern in the first photo-resist involves electron beam lithography.

5. The method as claimed in claim 1, wherein said step of forming the second pattern in the second photo-resist involves optical lithography.

6. The method as claimed in claim 1, wherein said steps of transferring said second pattern in said second photo-resist to said second mask layer and transferring said first pattern from said first mask layer to said second mask layer occur in the same processing step.

7. The method as claimed in claim 1, wherein said steps of transferring said first pattern from said second mask layer to the target layer and transferring said second pattern from said second mask layer to the target layer occur in the same processing step.

8. The method as claimed in claim 1, wherein said method further includes the step of removing said second photo-resist prior to transferring said first and second patterns from said second mask layer to said target layer.

9. The method as claimed in claim 1, wherein said method further includes the step of removing said second photo-resist following the step of transferring said first and second patterns from said second mask layer to said target layer.

10. A method of forming a micro-fabricated structure, said method comprising the steps of:
    forming a first pattern in a first photo-resist;
    removing a portion of said first photo-resist that is associated with a negative of said first pattern;
    transferring said first pattern in said first photo-resist to a first mask layer to provide a patterned first mask layer by removing a portion of said first mask layer to provide exposed portions of a second mask layer;
    depositing a second photo-resist on said exposed portions of said second mask layer;
    forming a second pattern in the second photo-resist;
    removing a portion of said second photo-resist that is associated with a negative of said second pattern;
    transferring said second pattern in said second photo-resist to said second mask layer;
    transferring said first pattern from said first mask layer to said second mask layer;
    transferring said first pattern from said second mask layer to a target layer while also transferring said second pattern from said second mask layer to the target layer; and
    removing said second mask layer.

11. The method as claimed in claim 10, wherein said step of forming the first pattern in the first photo-resist involves electron beam lithography.

12. The method as claimed in claim 10, wherein said step of forming the second pattern in the second photo-resist involves optical lithography.

13. The method as claimed in claim 10, wherein said first mask layer and said second mask layer are formed as a single mask layer that is thick enough to permit an upper portion thereof to provide the first mask layer and a bottom portion thereof to provide the second mask layer.

14. The method as claimed in claim 10, wherein said steps of transferring said second pattern in said second photo-resist to said second mask layer and transferring said first pattern from said first mask layer to said second mask layer occur in the same processing step.

15. The method as claimed in claim 10, wherein said method further includes the step of removing said second photo-resist prior to transferring said first and second patterns from said second mask layer to said target layer.

16. A method of forming a micro-fabricated structure, said method comprising the steps of:
    forming a first pattern in a first photo-resist;
    removing a portion of said first photo-resist that is associated with a negative of said first pattern;
    transferring said first pattern in said first photo-resist to a first mask layer to provide a patterned first mask layer by removing a portion of said first mask layer to provide exposed portions of a second mask layer;
    depositing a second photo-resist on said exposed portions of said second mask layer;
    forming a second pattern in the second photo-resist;
    removing a portion of said second photo-resist that is associated with a negative of said second pattern;
    transferring said second pattern in said second photo-resist to said second mask layer by removing a portion of said second mask layer while also transferring said first pattern from said first mask layer to said second mask layer by removing a portion of said second mask layer;
    transferring said first pattern from said second mask layer to a target layer while also transferring said second pattern from said second mask layer to the target layer; and
    removing said second mask layer.

17. The method as claimed in claim 16, wherein said step of forming the first pattern in the first photo-resist involves electron beam lithography.

18. The method as claimed in claim 16, wherein said step of forming the second pattern in the second photo-resist involves optical lithography.

19. The method as claimed in claim 16, wherein said step of removing the portion of said second photo-resist that is associated with the negative of said second pattern is done prior to the step of transferring said first pattern and said second pattern from said second mask layer to the target layer.

20. The method as claimed in claim 16, wherein said first mask layer and said second mask layer are formed as a single mask layer that is thick enough to permit an upper portion thereof to provide the first mask layer and a bottom portion thereof to provide the second mask layer.

* * * * *